(12) United States Patent
Imaoka

(10) Patent No.: US 6,778,032 B2
(45) Date of Patent: Aug. 17, 2004

(54) VOLTAGE CONTROLLED OSCILLATOR AND PHASE-LOCKED OSCILLATOR USING THE SAME

(75) Inventor: Toshikazu Imaoka, Ogaki (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 10/121,861

(22) Filed: Apr. 15, 2002

(65) Prior Publication Data
US 2002/0149436 A1 Oct. 17, 2002

(30) Foreign Application Priority Data
Apr. 16, 2001 (JP) .......................... 2001-117202

(51) Int. Cl.$^7$ ............................... H03B 5/32
(52) U.S. Cl. ..................... 331/185; 331/2; 331/158; 714/815
(58) Field of Search .................. 331/185, 2, 158, 331/17; 714/815

(56) References Cited

U.S. PATENT DOCUMENTS

| | | | |
|---|---|---|---|
| 5,463,353 A | * 10/1995 | Countryman et al. | 331/2 |
| 5,864,572 A | * 1/1999 | Bhagwan | 714/815 |
| 5,986,514 A | * 11/1999 | Salvi et al. | 331/17 |
| 6,137,374 A | * 10/2000 | Merrill | 331/158 |

FOREIGN PATENT DOCUMENTS

JP 60-53306 3/1985

* cited by examiner

Primary Examiner—Robert Pascal
Assistant Examiner—Joseph Chang
(74) Attorney, Agent, or Firm—Armstrong, Kratz, Quintos, Hanson & Brooks, LLP

(57) ABSTRACT

A control voltage is fed to an oscillation circuit from a control terminal, and a power supply voltage is fed thereto from a power supply terminal. An output circuit is provided between the oscillation circuit and an output terminal. The power supply terminal is connected to a feedback terminal through a DC separating capacitor and an amplifier. A signal leaking out to the power supply terminal from the oscillation circuit is fed to the amplifier through the DC separating capacitor. The amplifier amplifies the signal leaking out to the power supply terminal, and feeds the amplified signal to the feedback terminal as a feedback signal Loop.

24 Claims, 14 Drawing Sheets

F I G. 1
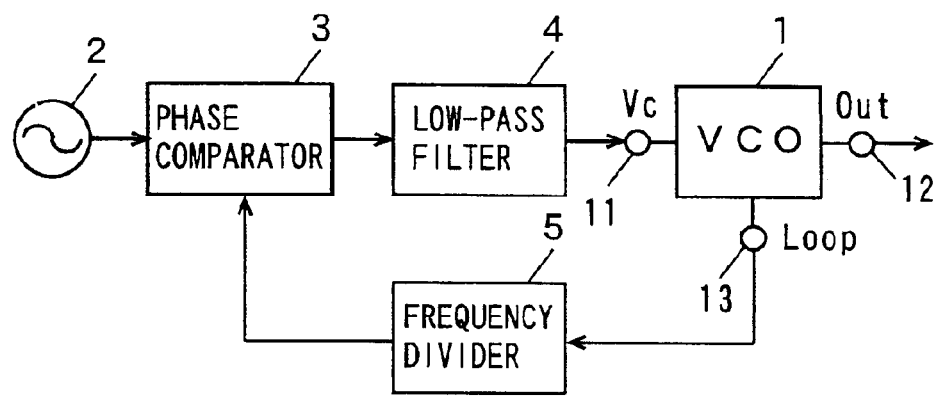
F I G. 2
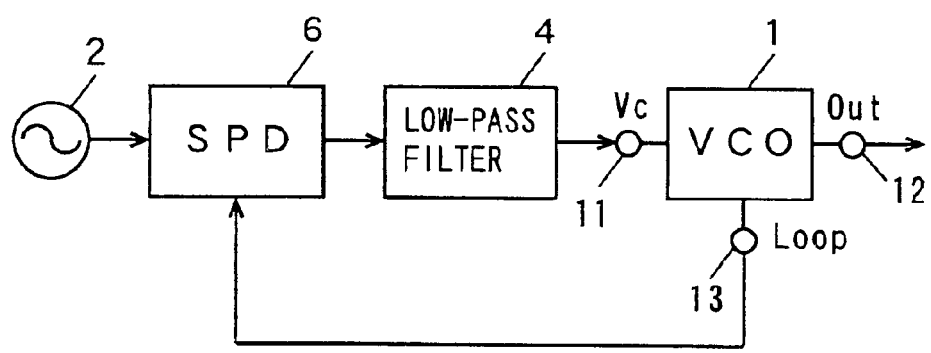

FIG. 12

| | UNIT | $P_{out}$①② | → | $P_{loop}$② | $P_{int}$①② | → | $P_{loop}$① | $P_{osc}$①② |
|---|---|---|---|---|---|---|---|---|
| ① INVENTIVE EXAMPLE | mW | 10 | ATTENUATOR 6dB | | 39.81 | DISTRIBUTION RATIO 0.025 | 1.0 | 40.81 |
| | dBm | +10 | | 1.0 | +16 | | 0 | +16.1 |
| ② COMPARATIVE EXAMPLE | mW | 10 | DISTRIBUTION RATIO 0.1 | 1.0 | 11 | ATTENUATOR 6dB | | 43.65 |
| | dBm | +10 | | 0 | +10.4 | | | 16.4 |

FIG. 14

| | UNIT | $P_{out}$①② | → | $P_{loop}$② | $P_{int}$①② | → | $P_{loop}$① | $P_{osc}$①② |
|---|---|---|---|---|---|---|---|---|
| ① INVENTIVE EXAMPLE | mW | 10 | ATTENUATOR 9dB | — | 79.43 | DISTRIBUTION RATIO 0.126 | 10 | 89.43 |
| | dBm | +10 | | | +19 | | 10 | +19.5 |
| ② COMPARATIVE EXAMPLE | mW | 10 | DISTRIBUTION RATIO 1.0 | 10 | 20 | ATTENUATOR 9dB | — | 158.87 |
| | dBm | +10 | | 10 | +13.0 | | | +22.0 |

F I G. 1 5
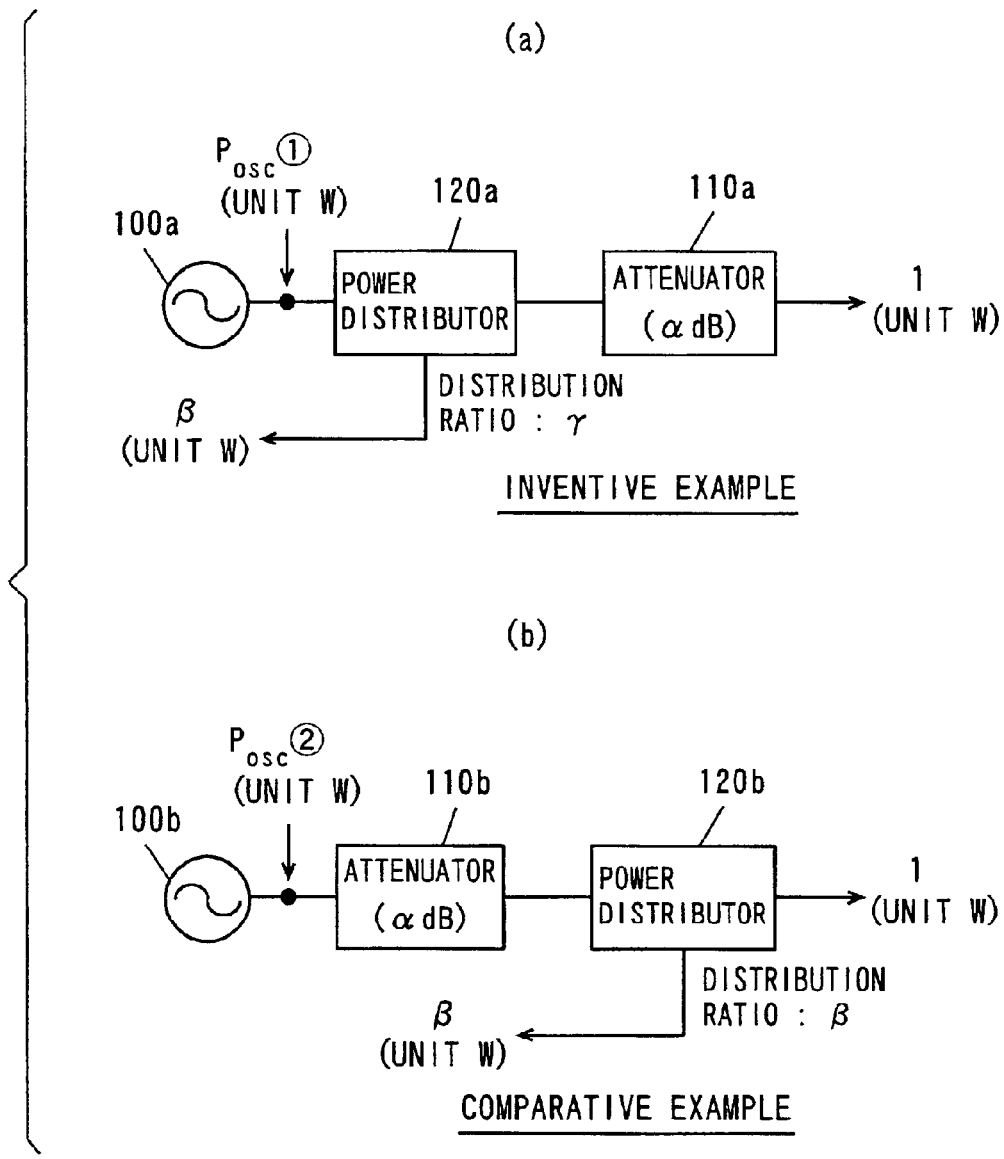

F I G. 1 7   PRIOR ART
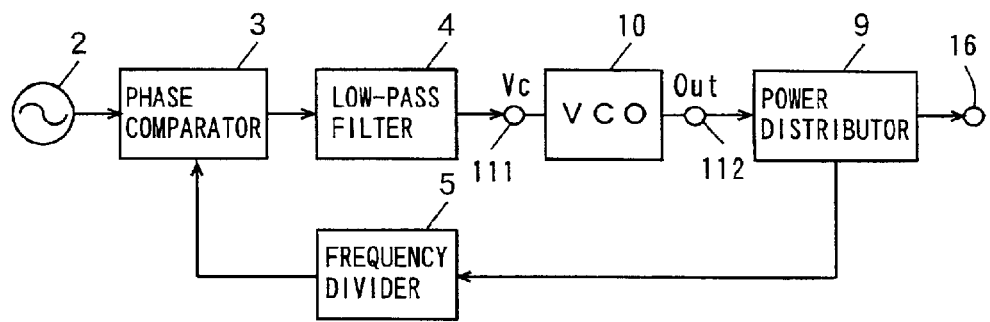
F I G. 1 8   PRIOR ART
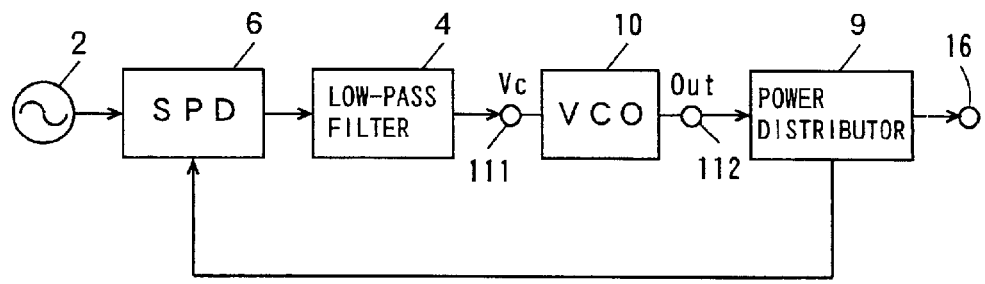
F I G. 1 9   PRIOR ART
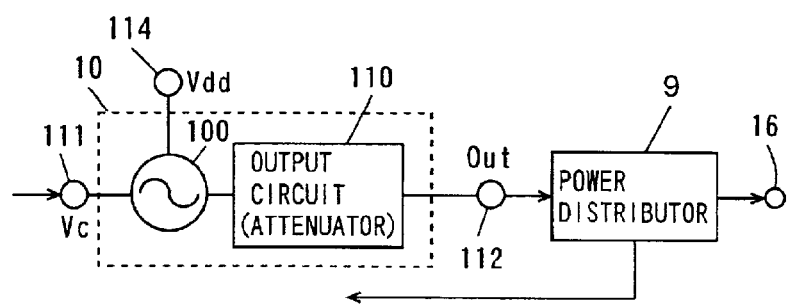

VOLTAGE CONTROLLED OSCILLATOR AND PHASE-LOCKED OSCILLATOR USING THE SAME

BACKGROUND OF THE INVENTION

1. Field of the Invention

The present invention relates to a voltage controlled oscillator capable of changing an oscillation frequency by voltage control and a phase-locked oscillator using the same.

2. Description of the Background Art

Conventionally, phase-locked oscillators (PLOs) using voltage controlled oscillators have been used as microwave oscillators for oscillating at microwave frequencies.

FIG. 17 is a block diagram showing an example of the configuration of a conventional frequency division type phase-locked oscillator.

In FIG. 17, the phase-locked oscillator comprises a reference signal source 2, a phase comparator 3, a low-pass filter 4, a voltage controlled oscillator (hereinafter referred to as VCO) 10, a power distributor 9, and a frequency divider 5.

The reference signal source 2 generates a reference signal. The phase comparator 3 compares the phase of the reference signal generated by the reference signal source 2 with the phase of a frequency division signal fed from the frequency divider 5, described later, and outputs a phase difference signal corresponding to a phase difference between the signals. The low-pass filter 4 passes a low frequency component of the phase difference signal outputted from the phase comparator 3, and feeds the low frequency component to a control terminal 111 of the VCO 10 as a control voltage Vc.

The VCO 10 outputs to an output terminal 112 an output signal Out having a frequency corresponding to the control voltage Vc at the control terminal 111. The output signal Out at the output terminal 112 of the VCO 10 is outputted to an output terminal 16 by the power distributor 9, and is fed to the frequency divider 5 as a feedback signal. The frequency divider 5 frequency-divides the feedback signal fed from the power distributor 9, and feeds the feedback signal to the phase comparator 3 as a frequency division signal. In such a way, a phase-locked loop is configured.

FIG. 18 is a block diagram showing an example of the configuration of a conventional sampling type phase-locked oscillator.

In FIG. 18, the phase-locked oscillator comprises a reference signal source 2, a sampling phase detector (hereinafter referred to as SPD) 6, a low-pass filter 4, a VCO 10, and a power distributor 9.

The reference signal source 2 generates a reference signal. The SPD converts the reference signal generated by the reference signal source 2 into a pulse train, samples a feedback signal fed from the power distributor 9, described later, using the pulse train, to detect a relative phase difference between the reference signal and the feedback signal, and feeds a phase difference signal to the low-pass filter 4. The low-pass filter 4 passes a low frequency component of the phase difference signal fed from the SPD 6, and feeds the low frequency component to a control terminal 111 of the VCO 10 as a control voltage Vc.

The VCO 10 outputs to an output terminal 112 an output signal Out having a frequency corresponding to the control voltage Vc at the control terminal 111. The output signal Out at the output terminal 112 of the VCO 10 is outputted to an output terminal 16 by the power distributor 9, and is fed to the SPD 6 as a feedback signal. In such a way, a phase-locked loop is configured.

In each of the phase-locked oscillators shown in FIGS. 17 and 18, when a load connected to the output terminal 16 varies, an oscillation frequency is changed. Therefore, JP-A-60-53306, for example, has proposed that in order to stabilize the oscillation frequency against the variation in the load, an output circuit composed of an attenuator, a buffer amplifier, an isolator, or the like is added to an oscillation circuit in the VCO, to separate the VCO and the load.

FIG. 19 is a block diagram showing the configuration of the VCO 10 in each of the phase-locked oscillators shown in FIGS. 17 and 18.

The VCO 10 comprises an oscillation circuit 100 and an output circuit 110. The output circuit 110 is composed of an attenuator, a buffer amplifier, an isolator, or the like. A control voltage Vc is fed to the control terminal 111 of the oscillation circuit 100. A power supply voltage Vdd is fed to a power supply terminal 114 of the oscillation circuit 100 by a DC power supply. Further, the oscillation circuit 100 is connected to the output terminal 112 through the output terminal 110 composed of an attenuator or the like.

In the conventional VCO 10, the output circuit 110 is thus inserted between the oscillation circuit 100 and the output terminal 112, thereby making it possible to stabilize the oscillation frequency against the variation in the load.

In the above-mentioned conventional phase-locked oscillator, the output circuit 110 is inserted between the oscillation circuit 100 in the VCO 10 and the output terminal 112. Accordingly, the output power of the oscillation circuit 100 is attenuated by passing through the output circuit 110. Consequently, the power of the feedback signal returned to the frequency divider 5 or the SPD 6 is attenuated. In order to obtain a feedback signal having predetermined power, therefore, the output power of the oscillation circuit 100 must be increased in consideration of the amount of attenuation by the output circuit 110. As a result, power consumption is increased.

SUMMARY OF THE INVENTION

An object of the present invention is to provide a voltage controlled oscillator capable of reducing the output power of an oscillation circuit while stabilizing an oscillation frequency against the variation in a load and a phase-locked oscillator using the same.

A voltage controlled oscillator according to an aspect of the present invention comprises a control terminal receiving a control voltage; an output terminal; a feedback terminal; an oscillation circuit that generates a signal having a frequency corresponding to the control voltage at the control terminal; a power supply terminal for applying a power supply voltage to the oscillation circuit; an output circuit that outputs to the output terminal the signal generated by the oscillation circuit; and a distribution circuit that distributes a part of the signal generated by the oscillation circuit to the feedback terminal as a feedback signal.

In the voltage controlled oscillator according to the present invention, the signal having the frequency corresponding to the control voltage at the control terminal is generated by the oscillation circuit, and is outputted to the output terminal by the output circuit. In this case, the output circuit is inserted between the oscillation circuit and the output terminal. Therefore, the oscillation frequency of the oscillation circuit is prevented from being changed by the variation in a load connected to the output terminal.

Furthermore, a part of the signal generated by the oscillation circuit is distributed to the feedback terminal as the feedback signal, whereby the feedback signal is not attenuated by the output circuit. Consequently, it is possible to reduce the output power of the oscillation circuit which is required to obtain the feedback signal having predetermined power.

Consequently, it is possible to reduce the output power of the oscillation circuit while stabilizing the oscillation frequency against the variation in the load.

In the voltage controlled oscillator, the distribution circuit may comprise a branch circuit that leads to the feedback terminal a signal leaking out to the power supply terminal from the oscillation circuit.

In this case, the signal leaking out to the power supply terminal from the oscillation circuit is used as the feedback signal. Consequently, the feedback signal is not attenuated by the output terminal.

The branch circuit may comprise a capacitor and an amplifier which are connected in series between the power supply terminal and the feedback terminal.

In this case, the passage of a DC component is rejected by the capacitor, and the signal leaking out to the power supply terminal from the oscillation circuit is amplified by the amplifier, and is fed to the feedback terminal as the feedback signal. Consequently, it is possible to further reduce the output power of the oscillation circuit which is required to obtain the feedback signal having predetermined power.

The distribution circuit may comprise a branch circuit that leads to the feedback terminal a signal leaking out to the control terminal from the oscillation circuit.

In this case, the signal leaking out to the control terminal from the oscillation circuit is used as the feedback signal. Consequently, the feedback signal is not attenuated by the output circuit.

The branch circuit may comprise a capacitor and an amplifier which are connected in series between the control terminal and the feedback terminal.

In this case, the passage of a DC component is rejected by the capacitor, and the signal leaking out to the control terminal from the oscillation circuit is amplified by the amplifier, and is fed to the feedback terminal as the feedback signal. Consequently, it is possible to further reduce the output power of the oscillation circuit which is required to obtain the feedback signal having predetermined power.

The distribution circuit may comprise a power distributor that distributes the signal generated by the oscillation circuit between the output circuit and the feedback terminal.

In this case, a part of the signal generated by the oscillation circuit is distributed to the feedback terminal by the power distributor in a stage preceding the output circuit, and is used as the feedback signal. Consequently, the feedback signal is not attenuated by the output circuit.

The voltage controlled oscillator may further comprise an amplifier that amplifies the signal fed to the feedback circuit from the power distributor.

In this case, the signal distributed by the power distributor is amplified by the amplifier, and is fed to the feedback terminal as the feedback signal. Consequently, it is possible to further reduce the output power of the oscillation circuit which is required to obtain the feedback signal having predetermined power.

The output circuit may comprise an attenuator, a buffer amplifier, or an isolator.

In this case, the change in the oscillation frequency of the oscillation circuit by the variation in the load connected to the output terminal is prevented by the attenuator, the buffer amplifier, or the isolator.

A phase-locked oscillator according to another aspect of the present invention comprises a reference signal source that generates a reference signal; a voltage controlled oscillator that outputs a signal having a frequency corresponding to a control voltage as an output signal and a feedback signal; a phase comparison circuit that compares the phase of the feedback signal from the voltage controlled oscillator or a signal based on the feedback signal with the phase of the reference signal generated by the reference signal source to output a phase difference signal representing a phase difference between the signals; and a control voltage application circuit that applies the phase difference signal outputted from the phase comparison circuit to the voltage controlled oscillator as the control voltage, the voltage controlled oscillator comprising a control terminal receiving the control voltage, an output terminal, a feedback terminal, an oscillation circuit that generates a signal having a frequency corresponding to the control voltage at the control terminal, a power supply terminal for applying a power supply voltage to the oscillation circuit, an output circuit that outputs to the output terminal the signal generated by the oscillation circuit, and a distribution circuit that distributes a part of the signal generated by the oscillation circuit to the feedback terminal as the feedback signal.

In the phase-locked oscillator according to the present invention, the reference signal is generated by the reference signal source. Further, the signal having the frequency corresponding to the control voltage is outputted as the output signal and the feedback signal by the voltage controlled oscillator. The phase of the feedback signal from the voltage controlled oscillator or the signal based on the feedback signal and the phase of the reference signal generated by the reference signal source are compared with each other by the phase comparison circuit, so that the phase difference signal representing the phase difference is outputted, and is applied to the voltage controlled oscillator as the control voltage by the control voltage application circuit. Therefore, a phase-locked loop is configured.

In the voltage controlled oscillator, the signal having the frequency corresponding to the control voltage at the control terminal is generated by the oscillation circuit, and is outputted to the output terminal by the output circuit. In this case, the output circuit is inserted between the oscillation circuit and the output terminal. Therefore, the oscillation frequency of the oscillation circuit is prevented from being changed by the variation in a load connected to the output terminal.

Furthermore, a part of the signal generated by the oscillation circuit is distributed to the feedback terminal as the feedback signal, whereby the feedback signal is not attenuated by the output circuit. Consequently, it is possible to reduce the output power of the oscillation circuit which is required to obtain the feedback signal having predetermined power.

Consequently, it is possible to reduce the output power of the oscillation circuit while stabilizing the oscillation frequency against the variation in the load.

The phase-locked oscillator may further comprise a frequency divider that frequency-divides the feedback signal outputted form the feedback terminal of the voltage controlled oscillator to output a frequency division signal, and the phase comparison circuit may comprise a phase comparator that compares the phase of the frequency division signal outputted by the frequency divider with the phase of the reference signal generated by the reference signal source.

In this case, a frequency division type phase-locked oscillator capable of reducing the output power of an oscillation circuit while stabilizing an oscillation frequency against the variation in a load is configured.

The phase comparison circuit may comprise a sampling phase comparator that converts the reference signal generated by the reference signal source into a pulse train, and samples the feedback signal outputted from the feedback terminal of the voltage controlled oscillator using the pulse train.

In this case, a sampling type phase-locked oscillator capable of reducing the output power of an oscillation circuit while stabilizing an oscillation frequency against the variation in a load is configured.

In the voltage controlled oscillator, the distribution circuit may comprise a branch circuit that leads to the feedback terminal a signal leaking out to the power supply terminal from the oscillation circuit.

In this case, the signal leaking out to the power supply terminal from the oscillation circuit is used as the feedback signal. Consequently, the feedback signal is not attenuated by the output circuit.

The branch circuit may comprise a capacitor and an amplifier which are connected in series between the power supply terminal and the feedback terminal.

In this case, the passage of a DC component is rejected by the capacitor, and the signal leaking out to the power supply terminal from the oscillation circuit is amplified by the amplifier, and is fed to the feedback terminal as the feedback signal. Consequently, it is possible to further reduce the output power of the oscillation circuit which is required to obtain the feedback signal having predetermined power.

The distribution circuit may comprise a branch circuit that leads to the feedback terminal a signal leaking out to the control terminal from the oscillation circuit.

In this case, the signal leaking out to the control terminal from the oscillation circuit is used as the feedback signal. Consequently, the feedback signal is not attenuated by the output circuit.

The branch circuit may comprise a capacitor and an amplifier which are connected in series between the control terminal and the feedback terminal.

In this case, the passage of a DC component is rejected by the capacitor, and the signal leaking out to the control terminal from the oscillation circuit is amplified by the amplifier, and is fed to the feedback terminal as the feedback signal. Consequently, it is possible to further reduce the output power of the oscillation circuit which is required to obtain the feedback signal having predetermined power.

The distribution circuit may comprise a power distributor that distributes the signal generated by the oscillation circuit between the output circuit and the feedback terminal.

In this case, a part of the signal generated by the oscillation circuit is distributed to the feedback terminal by the power distributor in a stage preceding the output circuit, and is used as the feedback signal. Consequently, the feedback signal is not attenuated by the output circuit.

The voltage controlled oscillator may further comprise an amplifier that amplifies the signal fed to the feedback circuit from the power distributor.

In this case, the signal distributed by the power distributor is amplified by the amplifier, and is fed to the feedback terminal as the feedback signal. Consequently, it is possible to further reduce the output power of the oscillation circuit which is required to obtain the feedback signal having predetermined power.

The output circuit may comprise an attenuator, a buffer, or an isolator.

In this case, the change in the oscillation frequency of the oscillation circuit by the variation in the load connected to the output terminal is prevented by the attenuator, the buffer amplifier, or the isolator.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the configuration of a phase-locked oscillator in a first embodiment of the present invention;

FIG. 2 is a block diagram showing the configuration of a phase-locked oscillator in a second embodiment of the present invention;

FIG. 12 is a diagram showing the process of calculating the oscillation power of an oscillation circuit in each of the VCOs in the inventive example and the comparative example shown in FIG. 11;

FIG. 14 is a diagram showing the process of calculating the oscillation power of an oscillation circuit in each of the VCOs in the inventive example and the comparative example shown in FIG. 13;

FIG. 15 is a diagram showing an example of the relationship between the amount of oscillation power and the amount of attenuation by an attenuator in each of the VCOs in the inventive example and the comparative example in generalized fashion;

FIG. 17 is a block diagram showing an example of the configuration of a conventional frequency division type phase-locked oscillator;

FIG. 18 is a block diagram showing an example of the configuration of a conventional sampling type phase-locked oscillator; and FIG. 19 is a block diagram showing the configuration of a VCO 10 in each of the phase-locked oscillators shown in FIGS. 17 and 18.

DESCRIPTION OF THE PREFERRED EMBODIMENTS

Figure 3:
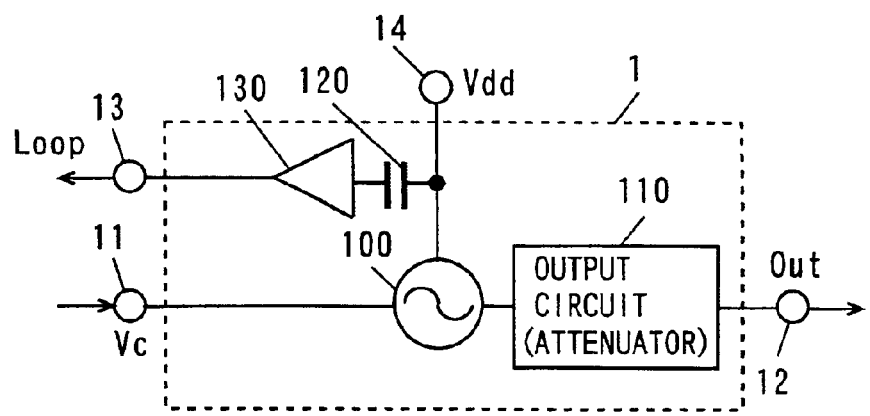
FIG. 3 is a block diagram showing a first example of the configuration of a VCO in each of the phase-clocked oscillators shown in FIGS. 1 and 2.

FIG. 1 is a block diagram showing the configuration of a phase-locked oscillator (PLO) in a first embodiment of the present invention. The phase-locked oscillator shown in FIG. 1 is a frequency division type phase-locked oscillator.

In FIG. 1, the phase-locked oscillator comprises a reference signal source 2, a phase comparator 3, a low-pass filter 4, a voltage controlled oscillator (hereinafter referred to as VCO) 1, and a frequency divider 5. The VCO 1 has a control terminal 11 receiving a control voltage Vc, an output terminal 12 for outputting an output signal Out, and a feedback terminal 13 for outputting a feedback signal Loop. The detailed configuration of the VCO 1 will be described later.

The reference signal source 2 generates a reference signal having a predetermined frequency, and feeds the reference signal to the phase comparator 3. The phase comparator 3 compares the phase of the reference signal fed from the reference signal source 2 with the phase of a frequency division signal fed from the frequency divider 5, described later, and feeds to the low-pass filter 4 a phase difference signal corresponding to a phase difference between the signals. The low-pass filter 4 passes a low frequency component of the phase difference signal fed from the phase comparator 3, and feeds the low-frequency component to the control terminal 11 of the VCO 1 as a control voltage Vc.

The VCO 1 outputs a signal having a frequency corresponding to the control voltage Vc fed to the control terminal 11 to the output terminal 12 as the output signal Out, and outputs the signal to the feedback terminal 13 as the feedback signal Loop. The frequency divider 5 frequency-divides the feedback signal Loop at the feedback terminal 13, and feeds the frequency division signal to the phase comparator 3. In such a way, a phase-locked loop (PLL) is configured.

FIG. 2 is a block diagram showing the configuration of a phase-locked oscillator in a second embodiment of the present invention. The phase-locked oscillator shown in FIG. 2 is a sampling type phase-locked oscillator.

In FIG. 2, the phase-locked oscillator comprises a reference signal source 2, a sampling phase detector (hereinafter referred to as SPD) 6, a low-pass filter 4, and a VCO 1. The detailed configuration of the VCO 1 will be described later.

The reference signal source 2 generates a reference signal having a predetermined frequency, and feeds the reference signal to the SPD 6. The SPD 6 changes the reference signal fed from the reference signal source 2 into a pulse train, samples a feedback signal Loop outputted to a feedback terminal 13 of the VCO 1, described later, using the pulse train, to detect a relative phase difference between the reference signal and the feedback signal Loop, and feeds a phase difference signal representing the relative phase difference to the low-pass filter 4. The low-pass filter 4 passes a low frequency component of the phase difference signal fed from the SPD 6, and feeds the low frequency component to a control terminal 11 of the VCO 1 as a control voltage Vc.

The VCO 1 outputs a signal having a frequency corresponding to the control voltage Vc at the control terminal 11 to an output terminal 12 as an output signal Out, and outputs the signal to the feedback terminal 13 as the feedback signal Loop. The feedback signal Loop at the feedback terminal 13 is fed to the SPD 6. In such a way, a phase-looked loop (PLL) is configured.

FIG. 3 is a block diagram showing a first example of the configuration of the VCO 1 in each of the phase-locked oscillators shown in FIGS. 1 and 2.

In FIG. 3, the VCO 1 comprises an oscillation circuit 100, an output circuit 110, a DC separating capacitor 120, and an amplifier 130. The control voltage Vc is fed to the oscillation circuit 100 from the control terminal 11. The output circuit 110 is connected between the oscillation circuit 100 and the output terminal 12. A load is connected to the output terminal 12. The output circuit 110 is composed of an attenuator, a buffer amplifier, an isolator, or the like. In the present embodiment, the output circuit 110 is composed of an attenuator. An oscillation frequency is stabilized against the variation in the load by the output circuit 110.

A power supply voltage Vdd is fed to the oscillation circuit 100 from a power supply terminal 14. The power supply terminal 14 is connected to the feedback terminal 13 through the DC separating capacitor 120 and the amplifier 130.

In the VCO 1 shown in FIG. 3, a signal leaking out to the power supply terminal 14 from the oscillation circuit 100 is fed to the amplifier 130 through the DC separating capacitor 120. The amplifier 130 amplifies the signal leaking out to the power supply terminal 14, and feeds the amplified signal to the feedback terminal 13 as the feedback signal Loop.

In this example, the signal leaking out to the power supply terminal 14 from the oscillation circuit 100 is used as the feedback signal Loop, whereby the feedback signal Loop is not attenuated by the output circuit 110. Consequently, it is possible to reduce the output power of the oscillation circuit 100 which is required to obtain the feedback signal Loop having predetermined power.

Figure 4:
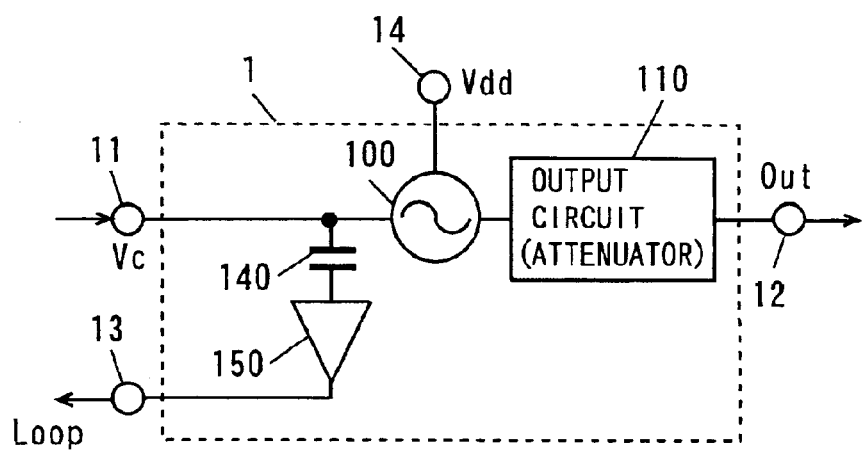
FIG. 4 is a block diagram showing a second example of the configuration of a VCO in each of the phase-locked oscillators shown in FIGS. 1 and 2.

FIG. 4 is a block diagram showing a second example of the configuration of the VCO 1 in each of the phase-locked oscillators shown in FIGS. 1 and 2.

The VCO 1 shown in FIG. 4 comprises an oscillation circuit 100, an output circuit 110, a DC separating capacitor 140, and an amplifier 150. The control voltage Vc is fed to the oscillation circuit 100 from the control terminal 11. The output circuit 110 is connected between the oscillation circuit 100 and the output terminal 12. A load is connected to the output circuit 110. An oscillation frequency is stabilized against the variation in the load by the output circuit 110.

A power supply voltage Vdd is fed to the oscillation circuit 100 from a power supply terminal 14. The control terminal 11 is connected to the feedback terminal 13 through the DC separating capacitor 140 and the amplifier 150.

In the VCO 1 shown in FIG. 4, a signal leaking out to the control terminal 11 from the oscillation circuit 100 is fed to the amplifier 150 through the DC separating capacitor 140.

The amplifier 150 amplifies the signal leaking out to the control terminal 11, and feeds the amplified signal to the feedback terminal 13 as the feedback signal Loop.

In this example, the signal leaking out to the control terminal 11 from the oscillation circuit 100 is used as the feedback signal Loop, whereby the feedback signal Loop is not attenuated by the output circuit 110. Consequently, it is possible to reduce the output power of the oscillation circuit 100 which is required to obtain the feedback signal Loop having predetermined power.

Figure 5:
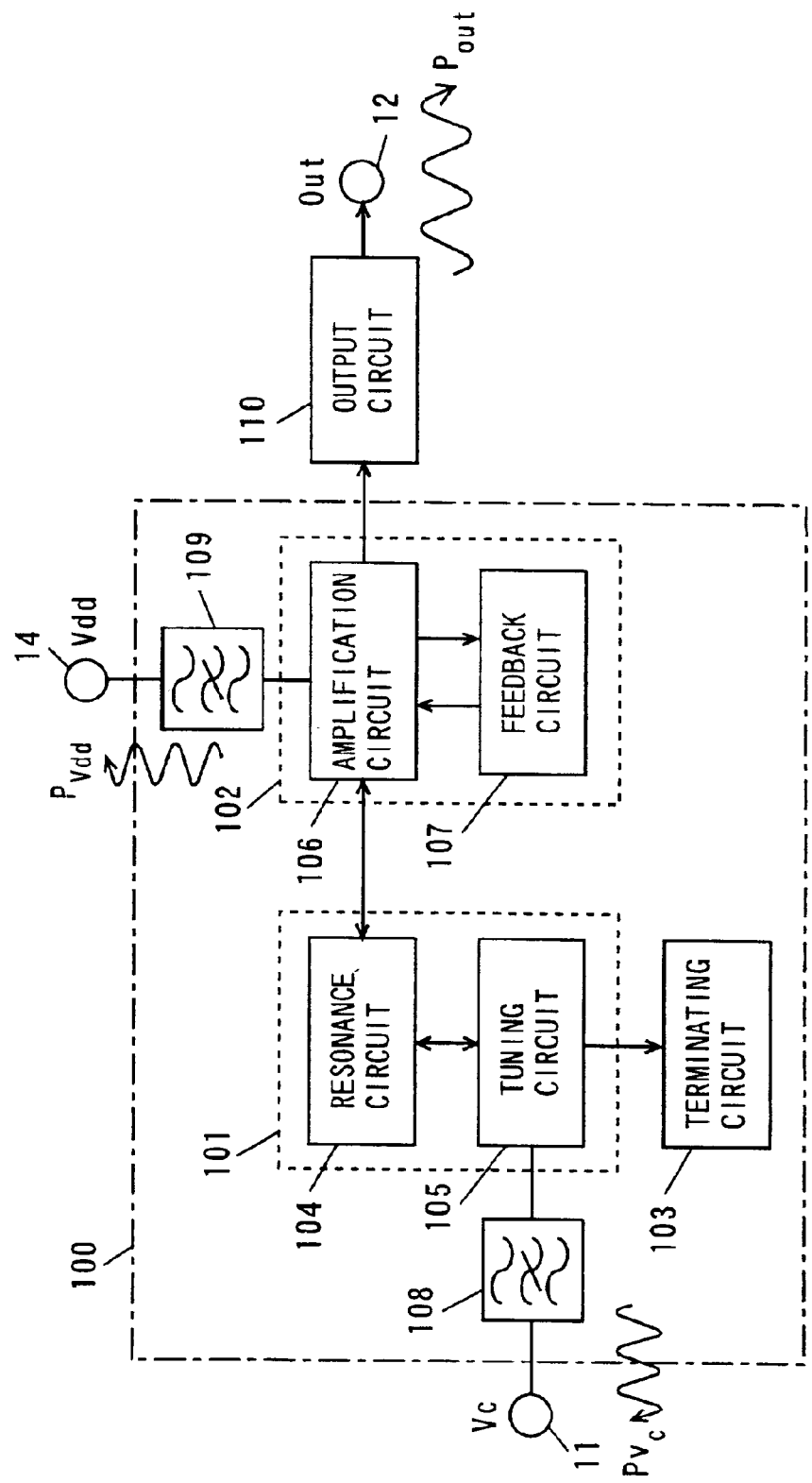
FIG. 5 is a block diagram mainly showing the configuration of an oscillation circuit in each of the VCOs shown in FIGS. 3 and 4.

FIG. 5 is a block diagram mainly showing the configuration of the oscillation circuit 100 in each of the VCOs 1 shown in FIGS. 3 and 4.

As shown in FIG. 5, the oscillation circuit 100 comprises a resonator 101, an oscillator 102, a terminating circuit 103, and band rejection filters (hereinafter referred to as BRFs) 108 and 109. The resonator 101 comprises a resonance circuit 104 and a tuning circuit 105, and performs a resonance operation. The terminating circuit 103 is connected to the resonator 101. The oscillator 102 comprises an amplification circuit 106 and a feedback circuit 107, and performs an oscillation operation.

The resonator 101 is connected to a control terminal 11 through the BRF 108. Further, the oscillator 102 is connected to the power supply terminal 14 through the BRF 109. The BRFs 108 and 109 are band-limited so as to reject the passage of a predetermined frequency (an oscillation frequency).

The resonance circuit 104 comprises a resonant element, and limits the frequency of an oscillation wave to a narrow band utilizing the resonance characteristics of the resonant element to reduce phase noise, thereby increasing the purity of the oscillation wave. The tuning circuit 105 comprises a variable capacitive element and a coupling portion to the resonance circuit 104. The tuning circuit 105 is coupled to the resonance circuit 104 to change the resonance frequency of the resonance circuit 104, thereby tuning the oscillation frequency.

The amplification circuit 106 comprises a transistor. The feedback circuit 107, together with the amplification circuit 106, constitutes a feedback loop, and returns an output signal of the amplification circuit 106 to the input side in phase, to enhance the oscillation.

The terminating circuit 103 consumes power having a frequency other than the oscillation frequency, as heat, to stabilize the oscillation operation.

Figure 6:
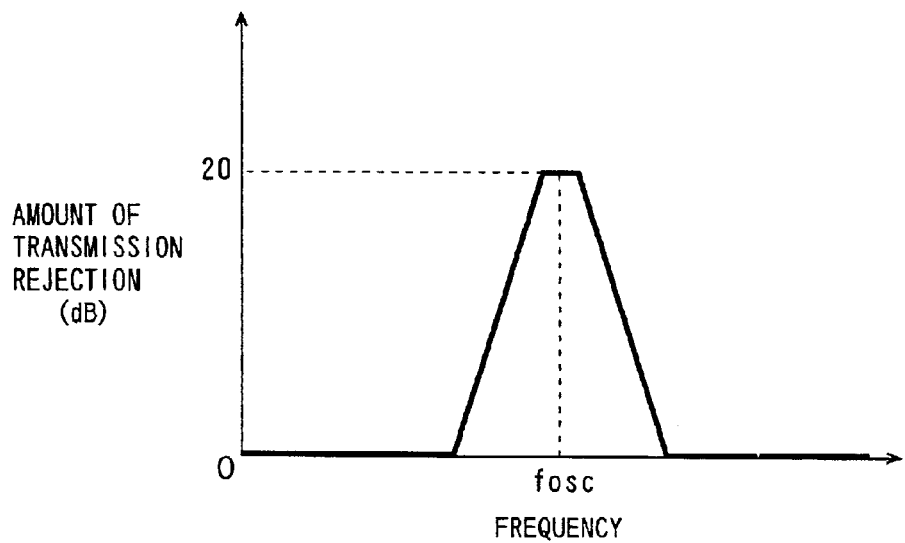
FIG. 6 is a diagram showing frequency characteristics relative to the amount of transmission rejection by a BRF in the oscillation circuit shown in FIG. 5.

FIG. 6 is a diagram showing frequency characteristics relative to the amount of transmission rejection by each of the BRFs 108 and 109 in the oscillation circuit 100 shown in FIG. 5. In the example shown in FIG. 6, the amount of transmission rejection at an oscillation frequency $f_{OSC}$ is 20 dB. In this case, only a part of the power having the oscillation frequency $f_{OSC}$ leaks out to the control terminal 11 and the power supply terminal 14 through the BRFs 108 and 109.

In FIG. 5, let $P_{Vc}$ be leakage power from the resonator 101 to the control terminal 11, $P_{out}$ be output power from the output circuit 110 to the output terminal 12, and $P_{Vdd}$ be leakage power from the oscillator 102 to the power supply terminal 14. In this case, $P_{Vc}$, $P_{out}$, and $P_{Vdd}$ have a relationship expressed by the following equation:

$$P_{out} \gg P_{Vdd}, P_{Vc}$$

When the amount of transmission rejection by each of the BRFs 108 and 109 is taken as 20 dB, as shown in FIG. 6, the leakage power $P_{Vdd}$ is expressed by the following equation:

$$P_{Vdd}=(P_{out}-20)[dBm]$$

When a coupling coefficient of the resonator 101 and the oscillator 102 is taken as −10 dB, the leakage power $P_{Vc}$ and the output power $P_{out}$ have a relationship expressed by the following equation:

$$P_{Vc}=(P_{out}-20-10)=P_{out}-30)[dBm]$$

The smaller the leakage power $P_{Vc}$ and the leakage power $P_{Vdd}$ are than the output power $P_{out}$, the less the effect of a connected state in the control terminal 11 and the power supply terminal 14 on the variation in the oscillation frequency becomes.

Figure 7:
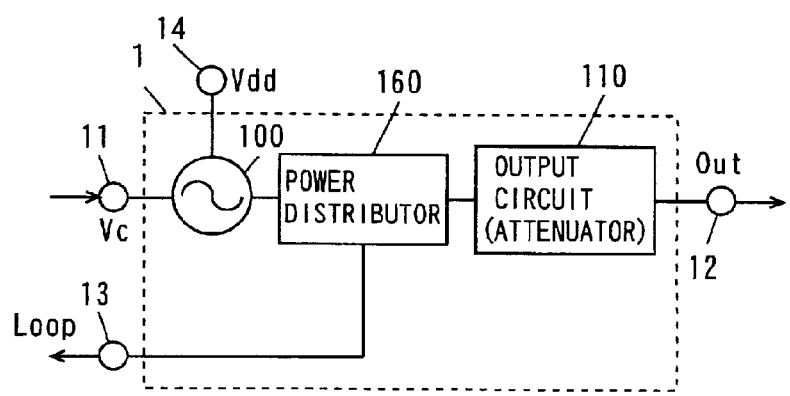
FIG. 7 is a block diagram showing a third example of the configuration of a VCO in each of the phase-locked oscillators shown in FIGS. 1 and 2.

FIG. 7 is a block diagram showing a third example of the configuration of each of the VCOs 1 in the phase-locked oscillators shown in FIGS. 1 and 2.

As shown in FIG. 7, the VCO 1 comprises an oscillation circuit 100, an output circuit 110, and a power distributor 160. A control voltage Vc is fed to the oscillation circuit 100 from the control terminal 11. An output signal of the oscillation circuit 100 is fed to the power distributor 160. The power distributor 160 distributes the output signal of the oscillation circuit 100 between the output circuit 110 and a feedback terminal 13. The output circuit 110 feeds the output signal fed from the power distributor 160 to the output terminal 12 as the output signal Out.

In this example, the output signal of the oscillation circuit 100 is distributed by the power distributor 160 in a stage preceding the output circuit 110, and is outputted to the feedback terminal 13 as the feedback signal Loop, whereby the feedback signal Loop is not attenuated by the output circuit 110. Consequently, it is possible to reduce the output power of the oscillation circuit 100 which is required to obtain the feedback signal Loop having predetermined power.

Figure 8:
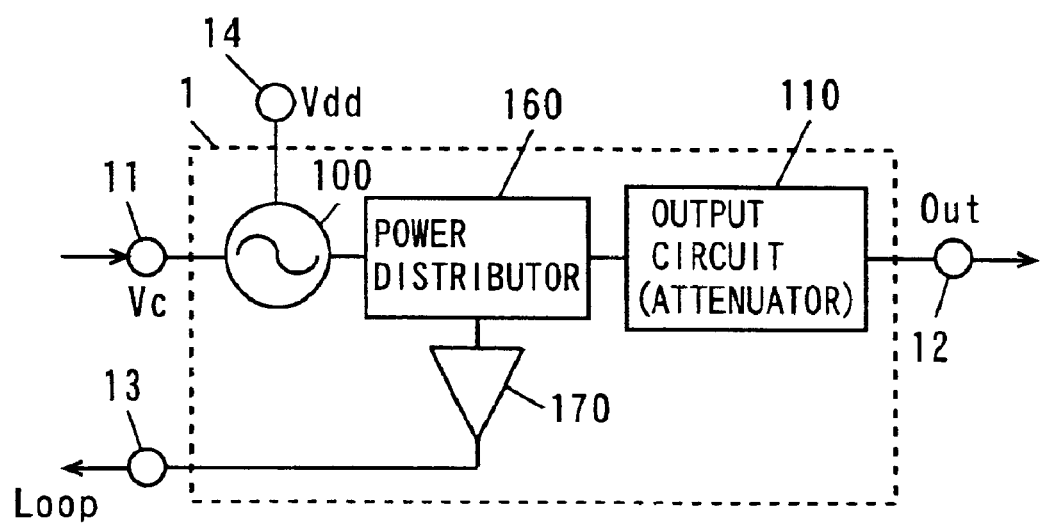
FIG. 8 is a block diagram showing a fourth example of the configuration of a VCO in each of the phase-locked oscillators shown in FIGS. 1 and 2.

FIG. 8 is a block diagram showing a fourth example of the configuration of each of the VCOs 1 in the phase-locked oscillators shown in FIGS. 1 and 2.

The VCO 1 shown in FIG. 8 differs from the VCO 1 shown in FIG. 7 in that an amplifier 170 is provided between a power distributor 160 and the feedback terminal 13.

Also in this example, an output signal of an oscillation circuit 100 is distributed by the power distributor 160 in a stage preceding an output circuit 110, and is outputted to the feedback terminal 13 as the feedback signal Loop, whereby the feedback signal Loop is not attenuated by the output circuit 110. Further, the signal distributed by the power distributor 160 is amplified by the amplifier 170. Consequently, it is possible to further reduce the output power of the oscillation circuit 100 which is required to obtain the feedback signal Loop having predetermined power.

The respective output powers of the oscillation circuits in the VCOs in an inventive example and a comparative example were compared with each other.

Figure 9:
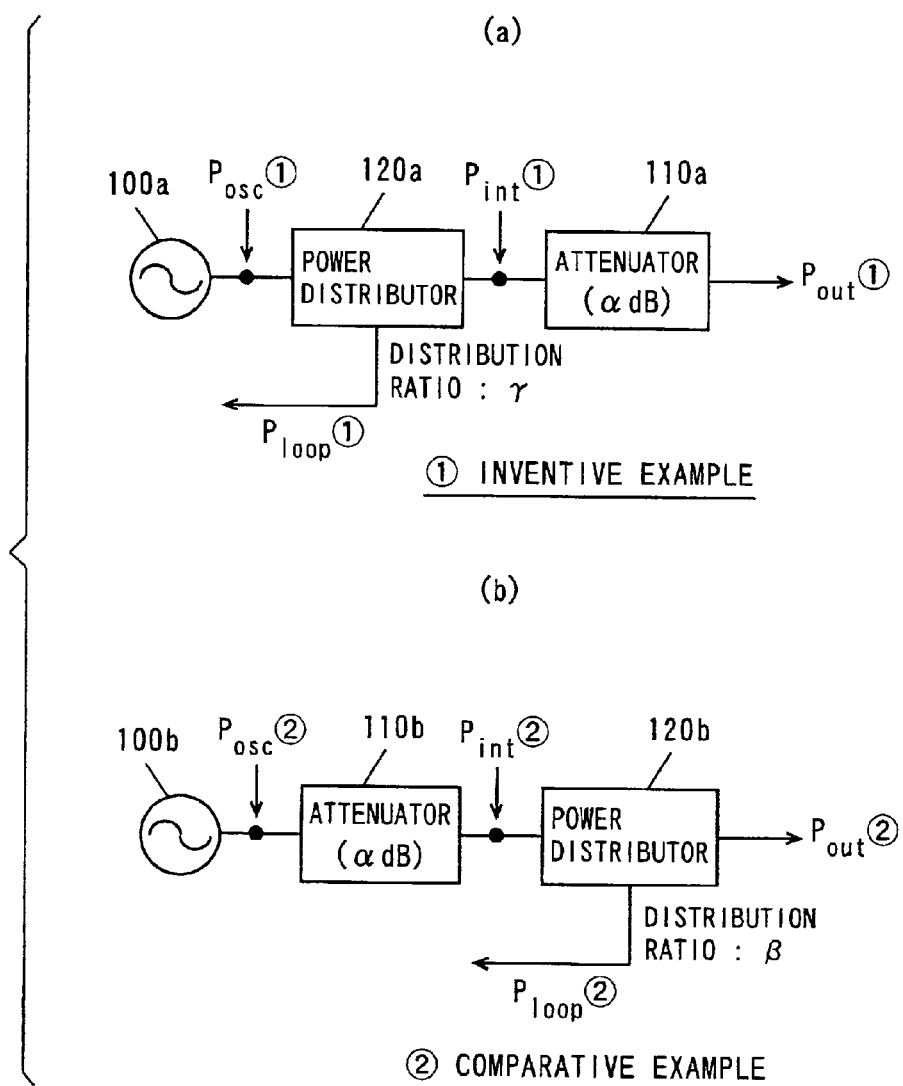
FIG. 9 is a block diagram showing the configuration of each of VCOs in an inventive example and a comparative example.

FIG. 9(a) is a block diagram showing the configuration of the VCO in the inventive example, and FIG. 9(b) is a block diagram showing the configuration of the VCO in the comparative example.

As shown in FIG. 9(a), in the VCO in the inventive example, a power distributor 120a is provided between an oscillation circuit 100a and an attenuator 110a. Let $P_{OSC}$① be oscillation power outputted from the oscillation circuit 100a, $P_{int}$①  be output power distributed to the attenuator 110a by the power distributor 120a, $P_{out}$① be output power of the attenuator 110a, and $P_{loop}$① be feedback power distributed by the power distributor 120a. Let γ be a distribution ratio in the power distributor 120a.

As shown in FIG. 9(b), in the VCO in the comparative example, an attenuator 10b is connected to a stage succeeding an oscillation circuit 110b, and a power distributor 120b is connected to a stage succeeding the attenuator 110b.

Let $P_{OSC}$② be oscillation power outputted to the attenuator 110b from the oscillation circuit 100b, $P_{int}$② be output power outputted to the power distributor 120b from the attenuator 110b, $P_{out}$② be output power distributed by the power distributor 120b, and $P_{loop}$② be feedback power distributed by the power distributor 120b. Let β be a distribution ratio in the power distributor 120b.

The oscillation powers $P_{OSC}$① and $P_{OSC}$② which are required when the output powers $P_{out}$① and $P_{out}$② are fixed and the feedback powers $P_{loop}$① and $P_{loop}$② are fixed are calculated and are compared with each other.

Figure 10:
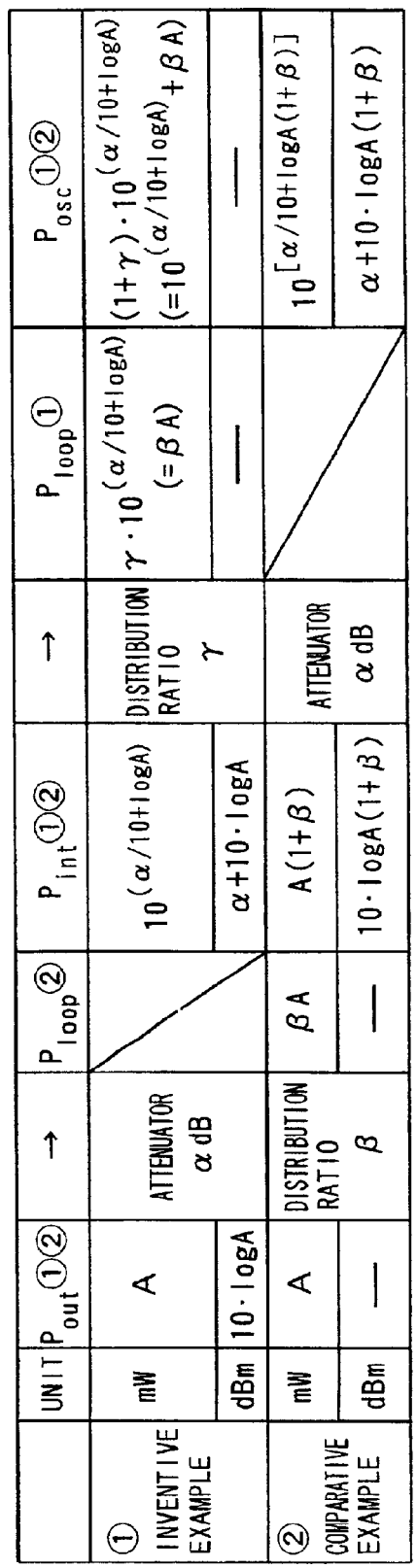
FIG. 10 is a diagram showing the process of calculating the oscillation power in each of the VCOs in the inventive example and the comparative example.

FIG. 10 is a diagram showing the respective processes of calculating the oscillation powers $P_{OSC}$① and $P_{OSC}$② in the VCOs in the inventive example and the comparative example. In FIG. 10, the amount of attenuation by each of the attenuators 110a and 10b is represented by a unit [dB], the amount of distribution by each of the power distributors 120a and 120b is represented by a unit [W], and a relationship of 1 mW=0 dBm (X[mW]→10·logX [dBm]) is used. Here, let α [dB] be the amount of attenuation by each of the attenuators 110a and 110b.

First, let $P_{out}$①=$P_{out}$①=A [mW]=10·logA [dBm].

In the VCO in the inventive example, the amount of attenuation by the attenuator 110a is α [dB]. Accordingly, the output power $P_{int}$① of the power distributor 120a is α+10·logA [dBm]=$10^{(\alpha/10+logA)}$ [mW]. Further, the distribution ratio in the power distributor 120a is γ. Accordingly, the feedback power $P_{loop}$① is γ·$10^{(\alpha/10+logA)}$ [mW].

Therefore, the oscillation power $P_{OSC}$① of the oscillation circuit 100a is (1+γ)·$10^{(\alpha/10+logA)}$ [mW].

In the VCO in the comparative example, the distribution ratio in the power distributor 120b is β. Accordingly, the feedback power $P_{loop}$② is βA [mW]. Consequently, the output power $P_{int}$② of the attenuator 110b is A(1+β) [mW]=10·logA(1+β) [dBm]. The amount of attenuation by the attenuator 110b is α [dB]. Accordingly, the oscillation power $P_{OSC}$② of the oscillation circuit 110b is α+10·logA (1+β) [dBm]=$10^{[\alpha/10+logA(1+\beta)]}$ [mW].

Furthermore, letting $P_{loop}$①=$P_{loop}$①, the following equation holds:

$$\gamma \cdot 10^{(\alpha/10+logA)} = \beta A$$

Consequently, the distribution ratio γ is expressed by the following equation:

$$\gamma = \beta A \cdot 10^{-(\alpha/10+logA)}$$

Furthermore, the oscillation power $P_{OSC}$① of the oscillation circuit 100a is expressed by the following equation:

$$P_{OSC}① = 10^{(\alpha/10+logA)} + \beta A$$

From the foregoing equation, the oscillation power $P_{OSC}$② of the oscillation circuit 100b is expressed by the following equation:

$$P_{OSC}② = 10^{[\alpha/10+logA(1+\beta)]}$$

Figure 11:
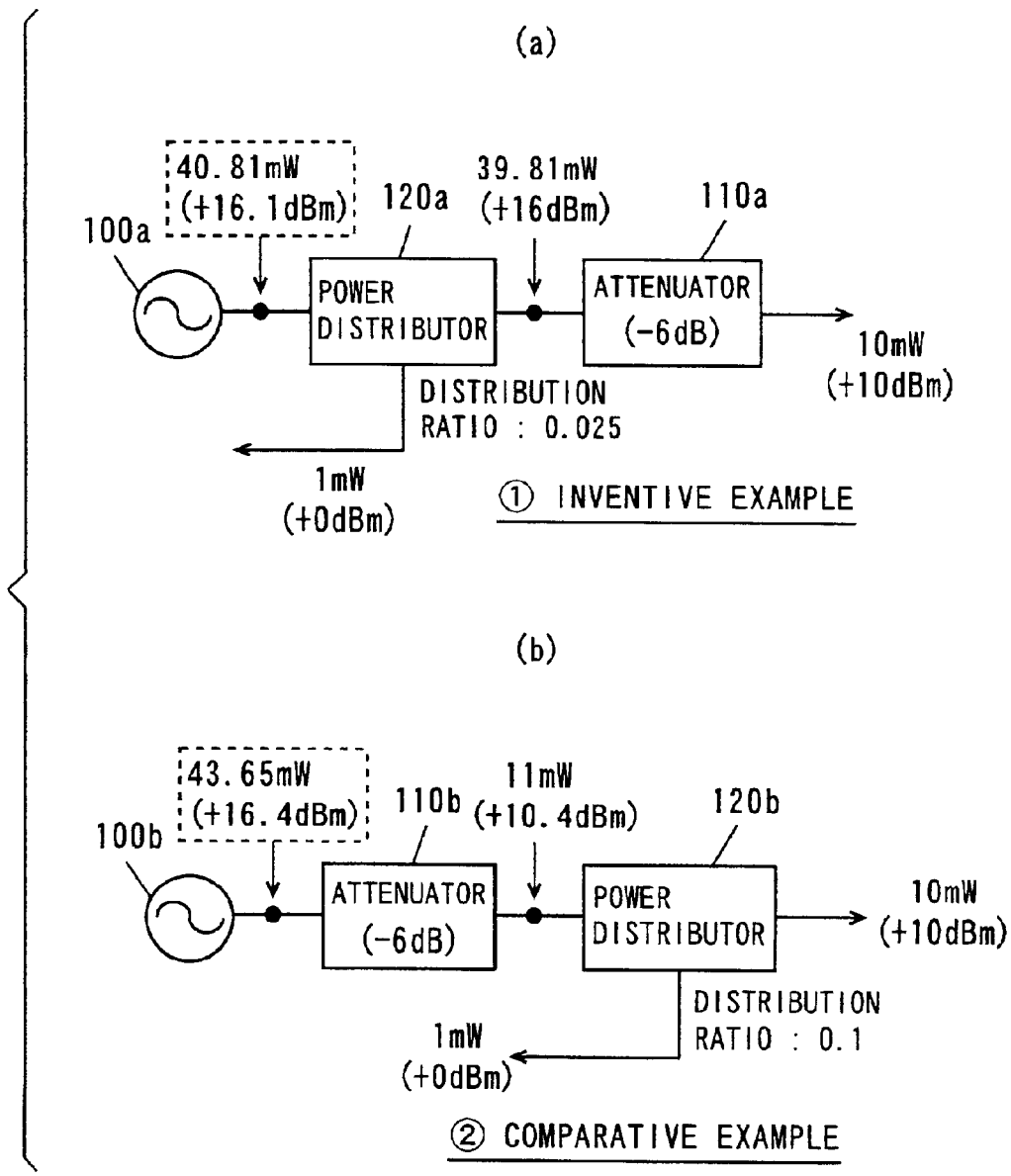
FIG. 11 is a diagram showing an example of specific numerical values of powers at respective portions in each of the VCOs in the inventive example and the comparative example.

FIGS. 11(a) and 11(b) are diagrams respectively showing examples of specific numerical values of powers at the respective portions in the VCOs in the inventive example and the comparative example. FIG. 12 is a diagram showing the respective processes of calculating the oscillation powers of the oscillation circuits 100a and 100b in the VCOs in the inventive example and the comparative example shown in FIG. 11.

FIGS. 11 and 12 illustrate a case where the amounts of attenuation by the attenuators 110a and 110b are small, and the feedback powers $P_{loop}$① and $P_{loop}$② are small.

In this example, the distribution ratio in the power distributor 120a in the inventive example is taken as 0.025, the distribution ratio in the power distributor 120b in the comparative example is taken as 0.1, and the amounts of attenuation by the attenuators 110a and 110b are taken as 6 dB.

In the VCO in the inventive example, the output power $P_{out}$① of the attenuator 110a is taken as 10 mW (+10 dBm). In this case, the amount of attenuation by the attenuator 110a is −6 dB. Accordingly, the output power $P_{int}$① of the power distributor 120a is 39.81 mW (+16 dBm). Further, the distribution ratio in the power distributor 120a is 0.025. Accordingly, the feedback power $P_{loop}$① is 1 mW (+0 dBm), and the oscillation power $P_{OSC}$① of the oscillation circuit 100a is 40.81 mW (+16.1 dBm).

On the other hand, in the VCO in the comparative example, the output power $P_{out}$② of the power distributor 120b is taken as 10 mW (+10 dBm). In this case, the distribution ratio in the power distributor 120b is 0.1. Accordingly, the feedback power $P_{loop}$② is 1 mW (+0 dBm), and the output power $P_{int}$② of the attenuator 110b is 11 mW (+10.4 dBm). Further, the amount of attenuation by the attenuator 110b is −6 dB. Accordingly, the oscillation power $P_{OSC}$② of the oscillation circuit 100b is 43.65 mW (+16.4 dBm).

The oscillation power $P_{OSC}$① of the oscillation circuit 100a in the VCO in the inventive example is thus reduced by approximately 3 mW, as compared with the oscillation power $P_{OSC}$② of the oscillation circuit 100b in the VCO in the comparative example. When the power supply voltage is 3 V, and the oscillation efficiency is 50%, therefore, an operating current can be reduced by approximately 2 mA.

Figure 13:
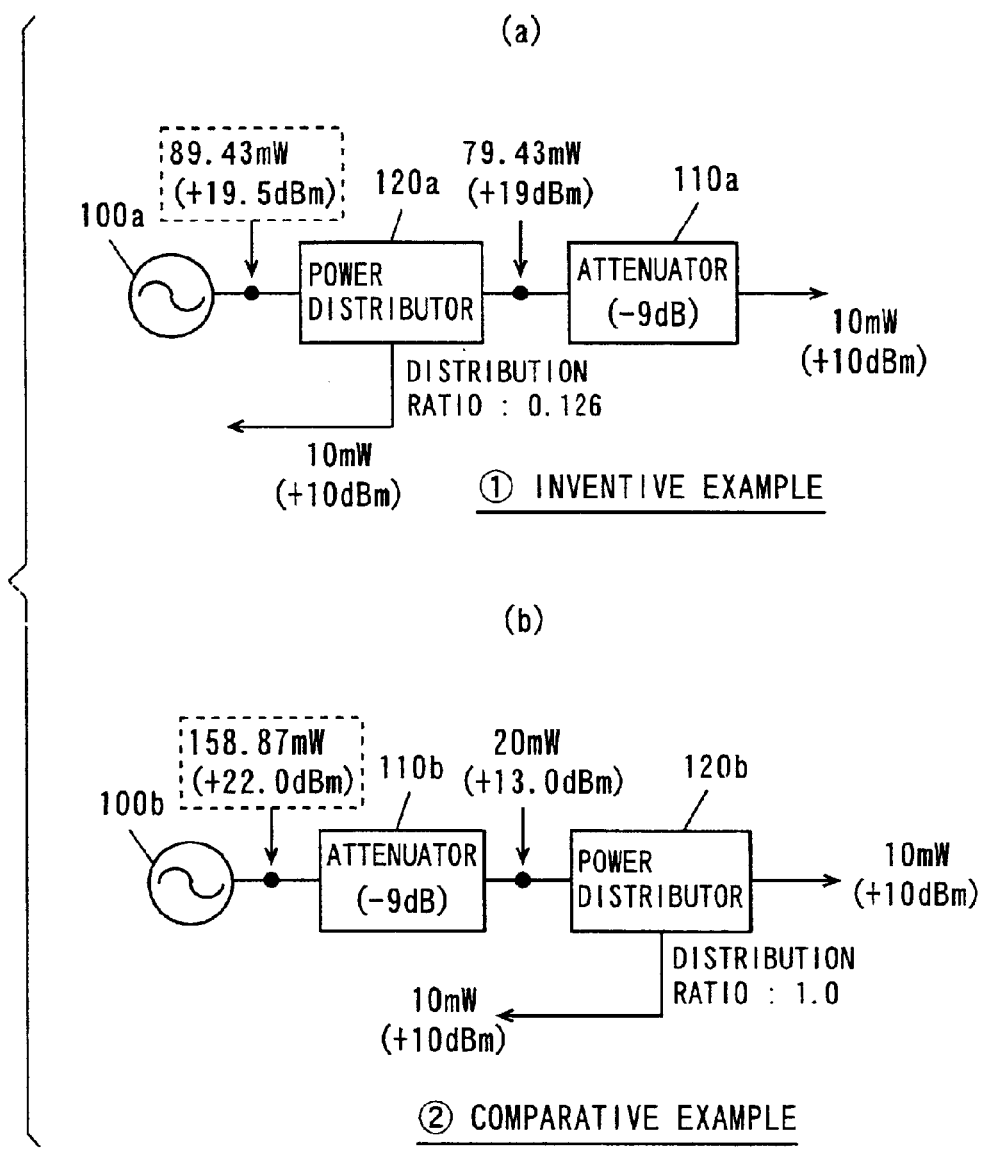
FIG. 13 is a diagram showing an example of specific numerical values of powers at respective portions in each of the VCOs in an inventive example and a comparative example.

FIGS. 13(a) and 13(b) are diagrams respectively showing examples of specific numerical values of powers at the respective portions in the VCOs in an inventive example and a comparative example. FIG. 14 is a diagram showing the respective processes of calculating the oscillation powers $P_{OSC}$① and $P_{OSC}$② of the oscillation circuits 100a and 100b in the VCOs in the inventive example and the comparative example shown in FIG. 13.

FIGS. 13 and 14 illustrate a case where the amounts of attenuation by the attenuators 110a and 110b are large, and the feedback powers $P_{loop}$① and $P_{loop}$② are large.

In this example, the distribution ratio in the power distributor 120a in the inventive example is taken as 0.126, the distribution ratio in the power distributor 120b in the comparative example is taken as 1.0, and the amounts of attenuation by the attenuators 110a and 110b are taken as 9 dB.

In the VCO in the inventive example, the output power $P_{out}$① of the attenuator 110a is taken as 10 mW (+10 dBm). In this case, the amount of attenuation by the attenuator 110a is −9 dB. Accordingly, the output power $P_{int}$① of the power distributor 120a is 79.43 mW (+19 dBm). Further, the distribution ratio in the power distributor 120a is 0.126. Accordingly, the feedback power $P_{loop}$① is 10 mW (+10 dBm), and the oscillation power $P_{OSC}$① of the oscillation circuit 100a is 89.43 mW (+19.5 dBm).

On the other hand, in the VCO in the comparative example, the output power $P_{out}$②  of the power distributor 120*b* is taken as 10 mW (+10 dBm). In this case, the distribution ratio in the power distributor 120*b* is 1.0. Accordingly, the feedback power $P_{loop}$② is 10 mW (+10 dBm), and the output power $P_{int}$② of the attenuator 110*b* is 20 mW (+13.0 dBm). Further, the amount of attenuation by the attenuator 110*b* is −9 dB. Accordingly, the oscillation power $P_{OSC}$② of the oscillation circuit 100*b* is 158.87 mW (+22.0 dBm).

The oscillation power $P_{OSC}$① of the oscillation circuit 100*a* in the VCO in the inventive example is thus reduced by approximately 69.44 mW, as compared with the oscillation power $P_{OSC}$② of the oscillation circuit 100*b* in the VCO in the comparative example. When the power supply voltage is 3 V, and the oscillation efficiency is 50%, therefore, an operating current can be reduced by approximately 46 mA.

Figure 16:
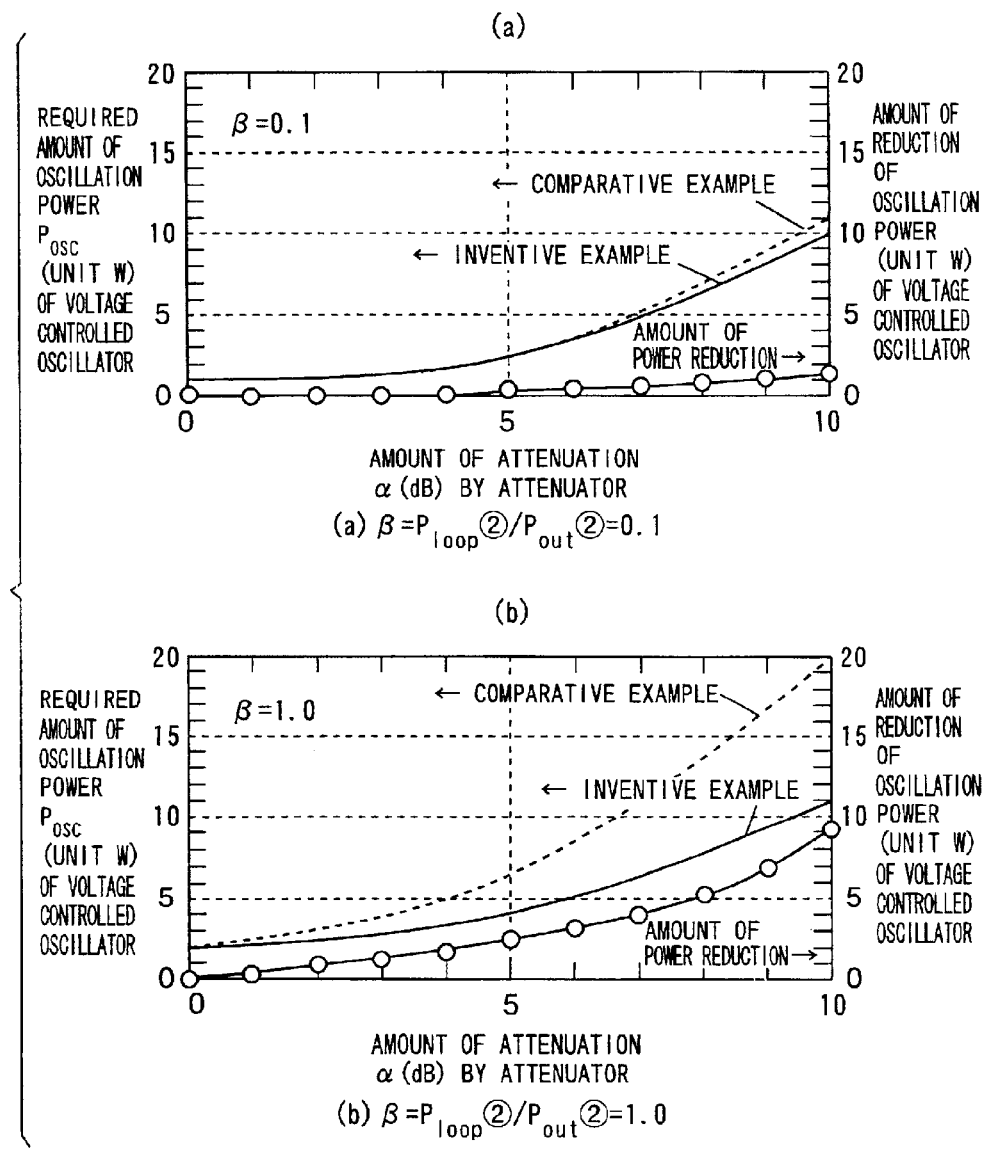
FIG. 16 is a diagram showing the relationship among the required amount of oscillation power, the amount of reduction of oscillation power, and the amount of attenuation by an attenuator in each of the VCOs in the inventive example and the comparative example.

FIGS. 15(*a*) and 15(*b*) are diagrams respectively showing the relationships between the amounts of oscillation powers and the amounts of attenuation by the attenuators in the VCOs in the inventive example and the comparative example in generalized fashion. FIGS. 16(*a*) and 16(*b*) are diagrams respectively showing the relationships among the required amounts of oscillation powers, the amounts of reduction of oscillation powers, and the amounts of attenuation by the attenuators in the VCOs in the inventive example and the comparative example, where 16(*a*) indicates a case where the distribution ratio in the power distributor 120*b* is β=$P_{loop}$②/$P_{out}$②=0.1, and FIG. 16(*b*) indicates a case where the distribution ratio in the power distributor 120*b* is β=$P_{loop}$②/$P_{out}$②=1.0.

As shown in FIG. 15(*a*), in the VCO in the inventive example, the output power $P_{out}$① of the attenuator 110*a* is taken as 1 [Unit W], the distribution ratio in the power distributor 120*a* is taken as γ, the feedback power is taken as β [Unit W], and the oscillation power of the oscillation circuit 100*a* is taken as $P_{OSC}$① [Unit W]. As shown in FIG. 15(*b*), in the VCO in the comparative example, the output power $P_{out}$② of the power distributor 120*b* is taken as 1 [Unit W], the distribution ratio in the power distributor 120*b* is taken as β, the feedback power is taken as β [Unit W], and the oscillation power of the oscillation circuit 100*b* is taken as $P_{OSC}$② [Unit W]. Further, let α [dB] be the amounts of attenuation by the attenuators 110*a* and 110*b*.

The oscillation power $P_{OSC}$① of the oscillation circuit 100*a* in the inventive example is expressed by the following equation:

$$P_{OSC}①=10^{(\alpha/10)}+\beta [\text{Unit } W]$$

On the other hand, the oscillation power $P_{out}$② of the oscillation circuit 100*b* in the comparative example is expressed by the following equation:

$$P_{out}②=10^{[\alpha/10+\log(1+\beta)]}[\text{Unit } W]$$

As shown in FIG. 16(*a*), when the distribution ratio β in the power distributor 120*a* is 0.1, the oscillation power $P_{OSC}$① of the oscillation circuit 100*a* in the VCO in the inventive example is made slightly lower than the oscillation power $P_{OSC}$② of the oscillation circuit 100*b* in the VCO in the comparative example. On the other hand, as shown in FIG. 16(*b*), when the distribution ratio β in the power distributor 120*b* is 1.0, the oscillation power $P_{OSC}$① of the oscillation circuit 100*a* in the VCO in the inventive example is significantly reduced, as compared with the oscillation power $P_{out}$② of the oscillation circuit 100*b* in the VCO in the comparative example. Further, as the amount of attenuation α [dB] by the attenuator 100*a* increases, the amount of power reduction in the oscillation circuit 100*a* in the VCO in the inventive example from that in the oscillation circuit 100*b* in the VCO in the comparative example increases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage controlled oscillator, comprising:
    a control terminal receiving a control voltage;
    an output terminal;
    a feedback terminal;
    an oscillation circuit that generates a signal having a frequency corresponding to the control voltage at said control terminal;
    a power supply terminal for applying a power supply voltage to said oscillation circuit;
    an output circuit that outputs to said output terminal the signal generated by said oscillation circuit; and
    a distribution circuit that distributes a part of the signal generated by said oscillation circuit to said feedback terminal as a feedback signal,
    wherein said distribution circuit comprises a branch circuit that leads to said feedback terminal a signal leaking out to said power supply terminal from said oscillation circuit.

2. The voltage controlled oscillator according to claim 1, wherein said branch circuit comprises a capacitor and an amplifier which are connected in series between said power supply terminal and said feedback terminal.

3. The voltage controlled oscillator according to claim 1, wherein said output circuit comprises an attenuator, a buffer amplifier, or an isolator.

4. A voltage controlled oscillator, comprising:
    a control terminal receiving a control voltage;
    an output terminal;
    a feedback terminal;
    an oscillation circuit that generates a signal having a frequency corresponding to the control voltage at said control terminal;
    a power supply terminal for applying a power supply voltage to said oscillation circuit;
    an output circuit that outputs to said output terminal the signal generated by said oscillation circuit; and
    a distribution circuit that distributes a part of the signal generated by said oscillation circuit to said feedback terminal as a feedback signal,
    wherein said distribution circuit comprises a branch circuit that leads to said feedback terminal a signal leaking out to said control terminal from said oscillation circuit.

5. The voltage controlled oscillator according to claim 4, wherein said branch circuit comprises a capacitor and an amplifier which are connected in series between said control terminal and said feedback terminal.

6. The voltage controlled oscillator according to claim 4, wherein said output circuit comprises an attenuator, a buffer amplifier, or an isolator.

7. A voltage controlled oscillator, comprising:
    a control terminal receiving a control voltage;
    an output terminal;

a feedback terminal;

an oscillation circuit that generates a signal having a frequency corresponding to the control voltage at said control terminal;

a power supply terminal for applying a power supply voltage to said oscillation circuit;

an output circuit that outputs to said output terminal the signal generated by said oscillation circuit; and a distribution circuit that distributes a part of the signal generated by said oscillation circuit to said feedback terminal as a feedback signal, wherein said distribution circuit comprises a power distributor that distributes the signal generated by said oscillation circuit between said output circuit and said feedback terminal.

8. The voltage controlled oscillator according to claim 7, further comprising an amplifier that amplifies the signal fed to said feedback circuit from said power distributor.

9. The voltage controlled oscillator according to claim 7, wherein said output circuit comprises an attenuator, a buffer amplifier, or an isolator.

10. A phase-locked oscillator, comprising:

a reference signal source that generates a reference signal;

a voltage controlled oscillator that outputs a signal having a frequency corresponding to a control voltage as an output signal and a feedback signal;

a phase comparison circuit that compares the phase of the feedback signal from said voltage controlled oscillator or a signal based on the feedback signal with the phase of the reference signal generated by said reference signal source to output a phase difference signal representing a phase difference between the signals; and a control voltage application circuit that applies the phase difference signal outputted from said phase comparison circuit to said voltage controlled oscillator as said control voltage, said voltage controlled oscillator comprising:
  a control terminal receiving said control voltage;
  an output terminal;
  a feedback terminal;
  an oscillation circuit that generates a signal having a frequency corresponding to the control voltage at said control terminal;
  a power supply terminal for applying a power supply voltage to said oscillation circuit, an output circuit that outputs to said output terminal the signal generated by said oscillation circuit; and
  a distribution circuit that distributes a cart of the signal generated by said oscillation circuit to said feedback terminal as said feedback signal,
  wherein said distribution circuit comprises a branch circuit that leads to said feedback terminal a signal leaking out to said power supply terminal from said oscillation circuit.

11. The phase-locked oscillator according to claim 10, wherein said branch circuit comprises a capacitor and an amplifier which are connected in series between said control terminal and said feedback terminal.

12. The phase-locked oscillator according to claim 10, further comprising:

a frequency divider that frequency-divides the feedback signal outputted from said feedback terminal of said voltage controlled oscillator to output a frequency division signal, said phase comparison circuit comprising a phase comparator that compares the phase of the frequency division signal outputted by said frequency divider with the phase of the reference signal generated by said reference signal source.

13. The phase-locked oscillator according to claim 10, wherein said branch circuit comprises a capacitor and an amplifier which are connected in series between said power supply terminal and said feedback terminal.

14. The phase-locked oscillator according to claim 10, wherein said output circuit comprises an attenuator, a buffer amplifier, or an isolator.

15. A phase-locked oscillator, comprising:

a reference signal source that generates a reference signal;

a voltage controlled oscillator that outputs a signal having a frequency corresponding to a control voltage as an output signal and a feedback signal;

a phase comparison circuit that compares the phase of the feedback signal from said voltage controlled oscillator or a signal based on the feedback signal with the phase of the reference signal generated by said reference signal source to output a phase difference signal representing a phase difference between the signals; and a control voltage application circuit that applies the phase difference signal outputted from said phase comparison circuit to said voltage controlled oscillator as said control voltage, said voltage controlled oscillator comprising:
  a control terminal receiving said control voltage;
  an output terminal;
  a feedback terminal;
  an oscillation circuit that generates a signal having a frequency corresponding to the control voltage at said control terminal;
  a power supply terminal for applying a power supply voltage to said oscillation circuit, an output circuit that outputs to said output terminal the signal generated by said oscillation circuit; and
  a distribution circuit that distributes a part of the signal generated by said oscillation circuit to said feedback terminal as said feedback signal,
  wherein said distribution circuit comprises a branch circuit that leads to said feedback terminal a signal leaking out to said control terminal from said oscillation circuit.

16. The phase-locked oscillator according to claim 15, wherein said branch circuit comprises a capacitor and an amplifier which are connected in series between said control terminal and said feedback terminal.

17. The phase-locked oscillator according to claim 15, further comprising a frequency divider that frequency-divides the feedback signal outputted from said feedback terminal of said voltage controlled oscillator to output a frequency division signal, said phase comparison circuit comprising a phase comparator that compares the phase of the frequency division signal outputted by said frequency divider with the phase of the reference signal generated by said reference signal source.

18. The phase-locked oscillator according to claim 15, wherein said branch circuit comprises a capacitor and an amplifier which are connected in series between said control terminal and said feedback terminal.

19. The phase-locked oscillator according to claim 15, wherein said output circuit comprises an attenuator, a buffer amplifier, or an isolator.

20. A phase-locked oscillator, comprising:

a reference signal source that generates a reference signal;

a voltage controlled oscillator that outputs a signal having a frequency corresponding to a control voltage as an output signal and a feedback signal;

a phase comparison circuit that compares the phase of the feedback signal from said voltage controlled oscillator or a signal based on the feedback signal with the phase of the reference signal generated by said reference signal source to output a phase difference signal representing a phase difference between the signals; and a control voltage application circuit that applies the phase difference signal outputted from said phase comparison circuit to said voltage controlled oscillator as said control voltage, said voltage controlled oscillator comprising:

a control terminal receiving said control voltage;

an output terminal;

a feedback terminal;

an oscillation circuit that generates a signal having a frequency corresponding to the control voltage at said control terminal;

a power supply terminal for applying a power supply voltage to said oscillation circuit, an output circuit that outputs to said output terminal the signal generated by said oscillation circuit; and a distribution circuit that distributes a part of the signal generated by said oscillation circuit to said feedback terminal as said feedback signal, wherein said distribution circuit comprises a power distributor that distributes the signal generated by said oscillation circuit between said output circuit and said feedback terminal.

21. The phase-locked oscillator according to claim 20, further comprising an amplifier that amplifies the signal fed to said feedback circuit from said power distributor.

22. The phase-locked oscillator according to claim 20, further comprising a frequency divider that frequency-divides the feedback signal outputted from said feedback terminal of said voltage controlled oscillator to output a frequency division signal, said phase comparison circuit comprising a phase comparator that compares the phase of the frequency division signal outputted by said frequency divider with the phase of the reference signal generated by said reference signal source.

23. The phase-locked oscillator according to claim 20, wherein said branch circuit comprises a capacitor and an amplifier which are connected in series between said control terminal and said feedback terminal.

24. The phase-locked oscillator according to claim 20, wherein said output circuit comprises an attenuator, a buffer amplifier, or an isolator.

\* \* \* \* \*